United States Patent [19]
Pelc et al.

[11] Patent Number: 4,710,717
[45] Date of Patent: Dec. 1, 1987

[54] METHOD FOR FAST SCAN CINE NMR IMAGING

[75] Inventors: Norbert J. Pelc, Wauwatosa; Gary H. Glover, Delafield, both of Wis.

[73] Assignee: General Electric Company, Milwaukee, Wis.

[21] Appl. No.: 947,211

[22] Filed: Dec. 29, 1986

[51] Int. Cl.$^4$ .......................................... G01R 33/20
[52] U.S. Cl. .................................... 324/309; 324/312; 128/653
[58] Field of Search ............... 324/366, 300, 307, 309, 324/312, 318, 322; 128/653

[56] References Cited

U.S. PATENT DOCUMENTS

| | | | |
|---|---|---|---|
| 4,115,730 | 9/1978 | Mansfield | 324/312 |
| 4,527,124 | 7/1985 | Van Uijen | 324/309 |
| 4,644,278 | 2/1987 | Sano et al. | 324/309 |
| 4,663,591 | 5/1987 | Pelc et al. | 324/309 |
| 4,672,320 | 6/1987 | Sekihara | 324/309 |

OTHER PUBLICATIONS

"Cardiac Imaging Using Gated Magnetic Resonance", Radiology, 1984; 150:121–127, from the Departments of Radiology and Medicine, Cardiovascular Division, University of California.

Primary Examiner—Michael J. Tokar
Attorney, Agent, or Firm—Quarles & Brady

[57] ABSTRACT

An NMR method for producing a sequence of images throughout the cardiac cycle is disclosed. A fast scan NMR pulse sequence is continuously and asynchronously applied during successive cardiac cycles, and a phase encoding magnetic field gradient is incremented between cardiac cycles to acquire NMR data which is reconstructed using a 2DFT technique. The phase encoding magnetic field gradient is stepped in subincrements, and the odd and even phase encoding views are acquired in separate segments of the procedure in order to eliminate image distortion due to disturbance of the residual transverse magnetization.

16 Claims, 7 Drawing Figures

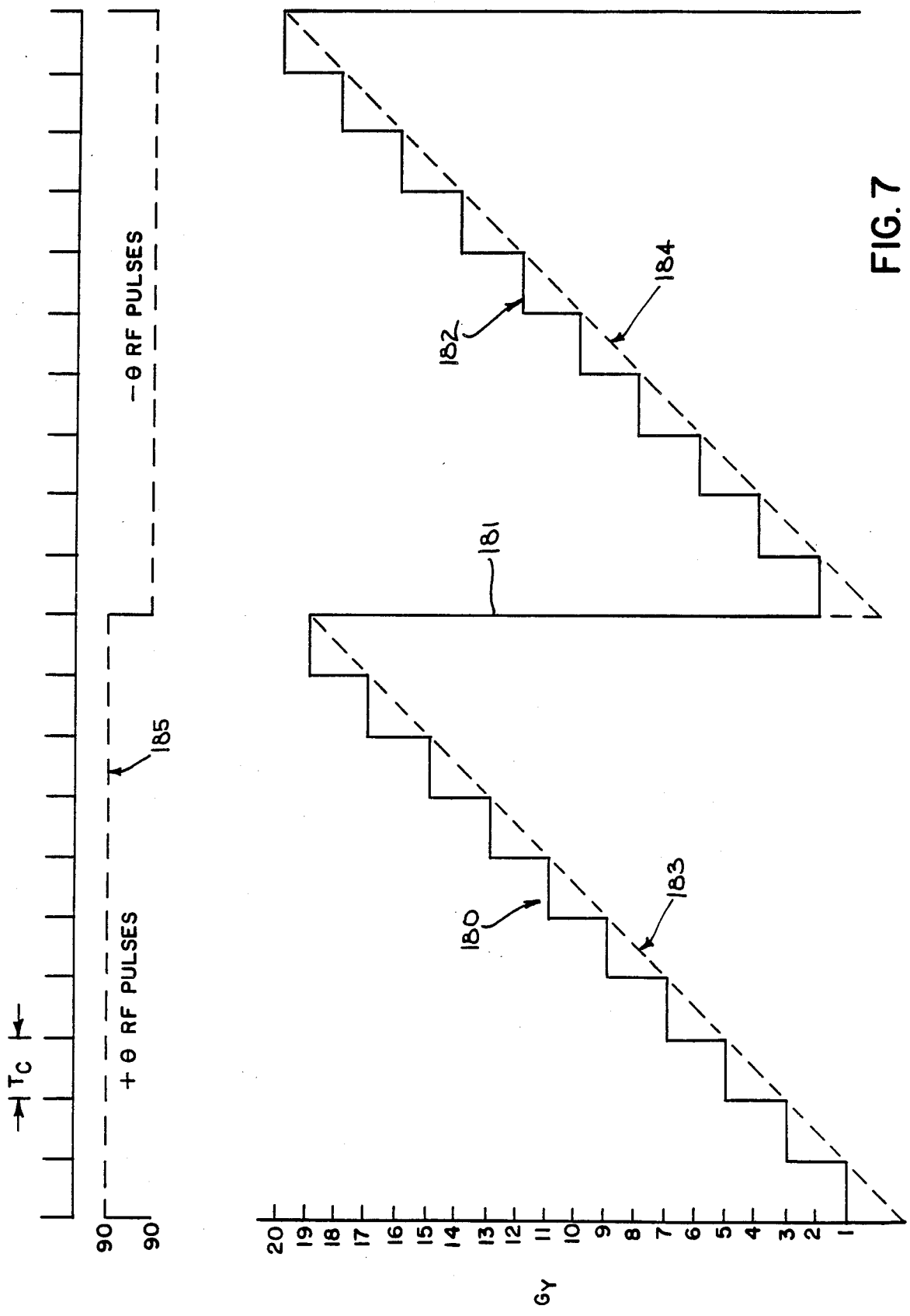

METHOD FOR FAST SCAN CINE NMR IMAGING

BACKGROUND OF THE INVENTION

The field of this invention is nuclear magnetic resonance (NMR) imaging methods, and particularly, the acquisition of images of an object which functions in a cyclic pattern such as the human heart.

NMR has been developed as an imaging modality which is utilized to obtain images of anatomical features of human patients. Such images depict distributions which are dependent upon nuclear spin density (typically, protons associated with water and tissue), spin-lattice relaxation time $T_1$, and/or spin-spin relaxation time $T_2$, and these are believed to be of medical diagnostic value in determining the state of health of the tissue examined. Data for constructing NMR images can be collected using one of many available techniques, such as multiple angle projection reconstruction and Fourier transform (FT). Typically, such techniques comprise a series of pulse sequences. Each pulse sequence comprises at least an RF excitation pulse which produces transverse magnetization in the processing nuclei, and a magnetic field gradient pulse which encodes spatial information into the resulting NMR signal. As is well known, the NMR signal may be a free induction decay (FID) or, preferably, a spin-echo signal. The NMR signals from the pulse sequences are processed to produce the desired image.

The preferred embodiments of the invention will be described in detail with reference to a variant of the FT technique, which is frequently referred to as "spin warp." It will be recognized, however, that the method of the invention is not limited to FT imaging technique, but may be advantageously practiced in conjunction with other techniques. The spin-warp technique is discussed in an article entitled "Spin Warp NMR Imaging and Applications to Human Whole-Body Imaging" by W. A. Edelstein, et al., *Physics in Medicine and Biology*, Vol. 25, pp. 751-756 (1980). Briefly, the spin-warp technique employs a variable amplitude phase encoding magnetic field gradient pulse prior to the acquisition of NMR spin-echo signals to phase encode spatial information in the direction of this encoding gradient. In a two-dimensional implementation (2DFT), spatial information is encoded in one direction by applying a phase-encoding gradient along that direction and then observing a spin-echo signal in the presence of a magnetic field gradient in a direction orthogonal to the phase-encoding direction. The gradient present during the spin echo encodes spatial information in the orthogonal direction. In a typical 2DFT data acquisition procedure, the magnitude of the phase-encoding gradient pulse is incremented monotonically in each successive pulse sequence so as to methodically produce NMR data which represent samples of the Fourier transform of the entire distribution to be imaged. Typically, 128 or 256 such sequences are required, the number depending on the desired spatial resolution and field of view in the phaseencoding direction.

Although it has been known that some NMR imaging pulse sequences produce artifacts due to object motion, early in the development of NMR imaging it was believed that among the advantages of the FT imaging method was its property of not producing motion artifacts. However, it is now well recognized that this is not so. Object motion during the acquisition of an NMR image produces both blurring, streaking and "ghosts" in the phase-encoded direction. Ghosts are particularly apparent when the motion is periodic, or nearly so, whereas streaks derive from random motion. For most physiological motion, including cardiac and respiratory motion, each NMR spin-echo or FID can be considered a snap-shot view of a portion of the object's Fourier transform. Blurring and ghosts are, therefore, due to the inconsistent disposition of the object from view to view rather than from motion during the view acquisition.

Both delecterious effects of periodic motion, blurring and ghosts, can be reduced if the data acquisition for each sequence is synchronized with the periodic motion. This method is known as gated scanning. Conventional gated cardiac NMR imaging techniques use a standard pulse sequence to gather data in synchrony with each heartbeat. The beginning of each data acquisition sequence is triggered by a programmed delay following the detected peak of a signal produced by the cardiac "QRS" wave complex. Thus, each heartbeat produces one view (phase encoding value) of the data set. After typically 128 or 256 heartbeats, sufficient data is available to produce the image. Because each data acquisition occurs when the heart is in the same phase of its motion cycle, the image so formed should represent an accurate picture of the heart at the selected point in its functional cycle. By altering the programmed delay time between the QRS peak and the commencement of the sequence, images may be formed of different phases of the cardiac cycle.

Unfortunately, the periodicity of the human heart is imperfect and the data acquired during successive heart beats may, in fact, capture the heart at slightly different phases of its cycle. The reconstructed image, therefore, will be somewhat degraded by blurring and other artifacts which result from view-to-view inconsistencies.

In addition to producing single images of the heart at specific phases of its cycle, there is significant medical value in producing a series of images which depict the heart at successive phases of its cycle. Indeed, a motion picture, or cine, of the heart cycle is desired. To minimize the amount of time a patient must spend in the NMR imager in order to acquire the necessary data, it is imparative that data for more than one image be gathered during each heart cycle.

In one prior art method, this is accomplished by exciting the slice of interest several times at fixed time intervals of, for example, 200 milliseconds during each cardiac cycle and using the same phase encoding amplitude for each. The data is sorted and employed to produce a set of images, for example, 4 or 5 at different delays with respect to the QRS complex. The later images in the set, unfortunately, suffer more from the above mentioned problems since they are farther removed in time from the cardiac signal landmark. In fact, it is essentially impossible to reliably image the late stages of the cardiac cycle in the face of variability in the heart rate with this prospective triggering method.

Other problems with prior art methods result from the fact that the functional cycle of the heart is not perfectly periodic. When the NMR pulse sequences are executed in synchronism with the heart's functional cycle as taught by the prior art, their repetition rate varies along with the heart rate. Where the repetition rate is relatively high, as when acquiring NMR data for four or five images, the NMR equilibrium due to T recovery will not be stable due to these variations. As a result, the image produced for the early part of the cardiac cycle will be degraded and will have a different appearance than the later images.

Another problem caused by variations in the cardiac cycle is that a guard band of extra time must be provided at the end of each cycle. This guard band must be chosen long enough to insure that the last NMR pulse sequence is executed before the shortest expected cardiac cycle is completed. As a result, either the number of images to be acquired must be reduced, or the time interval between NMR pulse sequences must be reduced.

SUMMARY OF THE INVENTION

The present invention relates to a method for producing a series of NMR images which depict an object, such as the human heart, at successive phases of its functional cycle. More particularly, the method includes: using a fast scan pulse sequence having a short data acquisition period; pulsing the sequence repeatedly but asynchronously with the functional cycle; detecting the beginning of each functional cycle and recording the phase of the functional cycle at which each pulse sequence is run, altering a field gradient during a set of successive functional cycles to alter the phase encoding contained in the acquired data; and reconstructing an image from the acquired data at a selected phase of the functional cycle by interpolating between data acquired to either side of the selected phase for each required phase encoding.

A general object of the invention is to provide an accurate image of an object which performs a cyclical function where the period of the functional cycle varies. Rather than attempting to acquire NMR data at the same point, or phase, of each of a set of successive functional cycles, NMR data is acquired at a rapid rate throughout each functional cycle. Because the data acquisition is free-running and asynchronous with respect to the functional cycle, when an image is reconstructed to depict the object at a selected phase, an interpolation algorithm is employed to produce the needed image data from NMR data acquired adjacent to the selected phase.

Another object of the invention is to produce a series of NMR images which depict the object at successive phases of its functional cycle. Since a large amount of data is acquired throughout each functional cycle, a set of images may be reconstructed. The images may depict the object at successive phases of its cycle so that a moving picture, or cine, may be produced. Because of the asynchronous nature of the data acquisition, data may be gathered throughout each cycle of the object regardless of its period and regularity. This reduces the amount of time needed to gather data for a large number of images. Since interpolation is performed retrospectively after data are acquired, the problems associated with prospective triggering can be overcome and the later stages of the cardiac cycle can be imaged reliably.

Another aspect of the present invention is the particularly sequence in which the radio frequency excitation pulses and the spatial encoding magnetic field gradient pulses are applied during the data acquisition sequence. Because a fast scan pulse sequence is employed and the scan is executed repeatedly and continuously, residual transverse magnetization accumulates from each pulse sequence and adds to the NMR signal produced during subsequent pulse sequences. As long as the pulse sequence remains unchanged, this residual transverse magnetization reaches an equilibrium value and it does not impare the reconstructed images. But the spatial encoding magnetic field gradient must be incrementally changed in order to acquire data for each entire image. So as not to disturb this equilibrium, therefore, the present invention contemplates breaking into subincrements the normal incremental change in the spatial encoding magnetic field gradient. Rather than making a large incremental change in this field gradient at the end of each functional cycle, the spatial encoding magnetic field gradient is changed in subincrements throughout the functional cycle of the object being imaged. These subincremental changes are not sufficient in magnitude to disturb the equilibrium of the residual transverse magnetization, and they do not, therefore, impare the reconstructed images.

In yet another aspect of the invention, phase cycling of the r.f. excitation pulse in order to compensate for baseline errors in the system is accomplished without disturbing the dynamic equilibrium of the transverse magnetization. Rather than altering the sign of the r.f. pulse after each pulse sequence as is normally required by this technique, the order in which the phase encoding amplitude is incremented from one view to the next is chosen so that only one r.f. excitation pulse sign alteration occurs during the entire data acquisition session, and it preferrably occurs at the extreme values of the phase encoding amplitude where its effect on the reconstructed image is negligible.

The foregoing and other objects and advantages of the invention will appear from the following description. In the description, reference is made to the accompanying drawings which from a part hereof, and in which there is shown by way of illustration a preferred embodiment of the invention. Such embodiment does not necessarily represent the full scope of the invention, however, and reference is made therefore to the claims herein for interpreting the scope of the invention.

BRIEF DESCRIPTION OF THE DRAWINGS

FIG. 7 is a graphic representation which illustrates yet a further improvement to the asynchronous fast scan sequence of FIGS. 3 and 4 which minimizes disturbance of the residual magnetization and improves image quality.

DESCRIPTION OF THE PREFERRED EMBODIMENT

Figure 1:
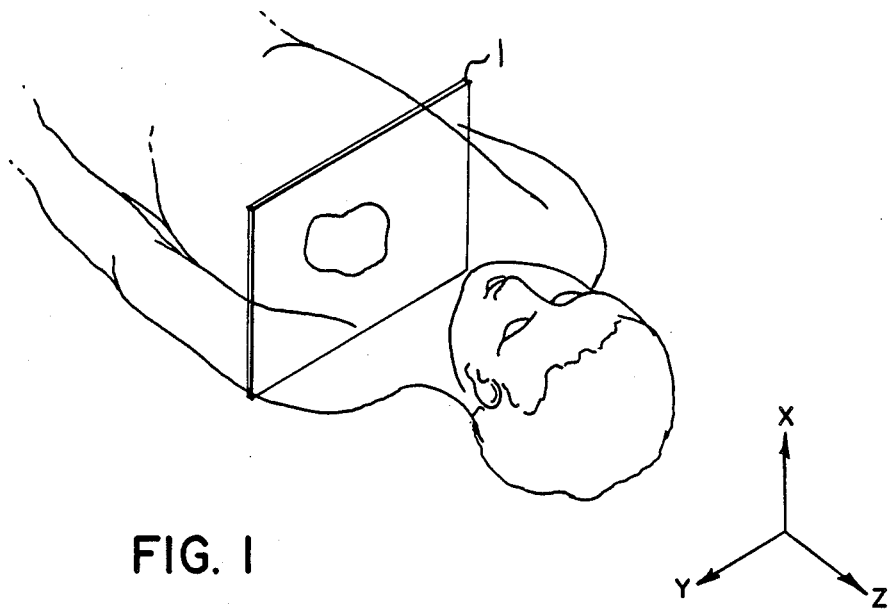
FIG. 1 is a pictoral view of a patient which shows an image which may be formed using the NMR method of the present invention.

Referring particularly to FIG. 1, the present invention is embodied in a full body NMR imaging system which is capable of receiving a patient and producing a two-dimensional image which indicates spin density at a flat slice, or cross section taken through the patient. The position and orientation of the slice, which is to be imaged, is determined by the magnitude of the magnetic field gradients applied along the respective x, y and z axis of the NMR imaging system. A slice 1 is shown in FIG. 1 which is taken through the patient's heart, and as described below, a sequence of data is acquired which enables a series of images to be produced that show the heart as it changes throughout the cardiac cycle. Indeed, it is possible with the present invention to produce a motion picture, or cine, of the patient's cardiac cycle.

Figure 2:
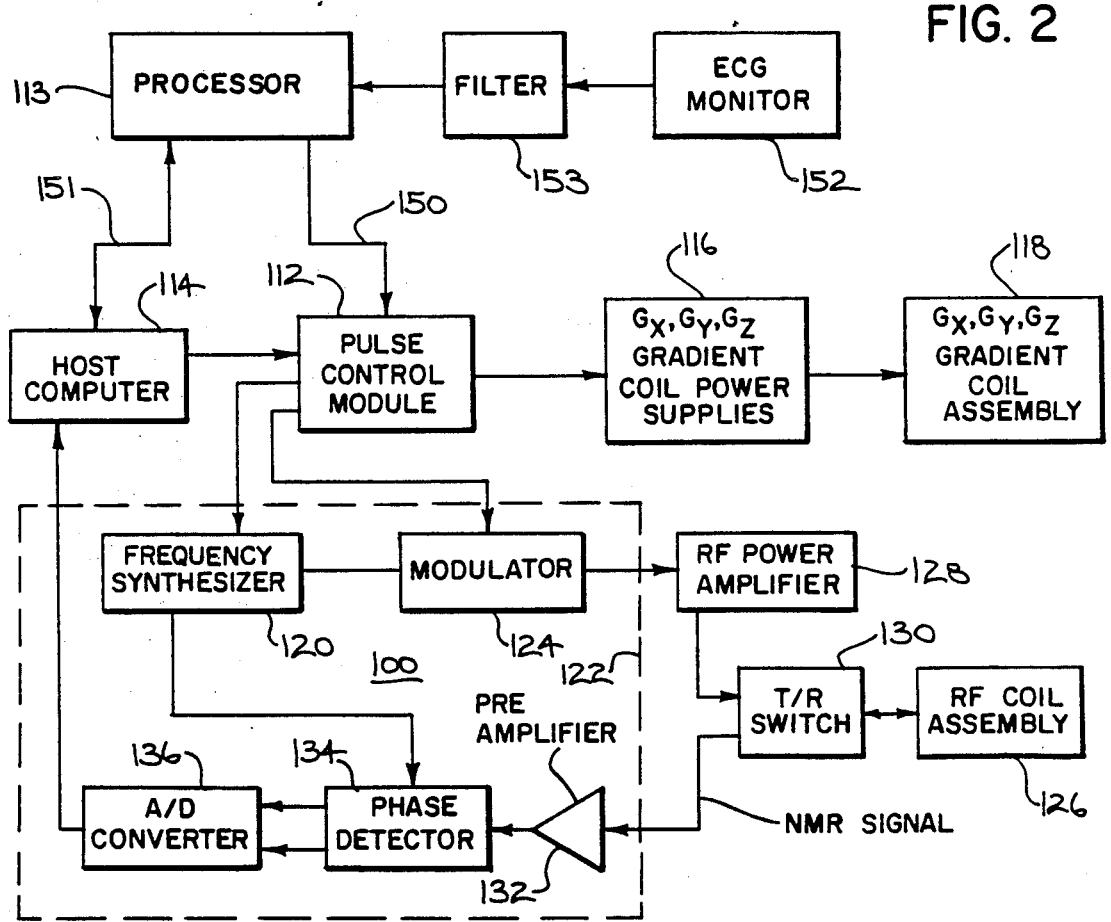
FIG. 2 is an electrical block diagram of an NMR system which employs the present invention.

The preferred embodiment of the invention is incorporated in an NMR imaging system which is commercially available from the General Electric Company and is sold under the trademark "Signa." FIG. 2 is a simplified block diagram of this NMR imaging system. The system includes a pulse control module 112 which receives command signals from a host computer 114 and a separate processor 113. The pulse control module 112 provides properly timed pulse waveform signals to magnetic field gradient power supplies collectively designated 116 which energize gradient coils forming part of a gradient coil assembly generally indicated by a block 118. The assembly 118 contains coils which, when energized by the power supplies, produce the $G_x$, $G_y$, and $G_z$ magnetic fields in the direction of the polarizing magnetic field, but with gradients directed in the x, y, and z directions, respectively, of the Cartesian coordinate system. The use of the $G_x$, $G_y$ and $G_z$ gradients in NMR imaging applications is well known in the art, and the specific use in the present invention will be described in more detail below.

Continuing with reference to FIG. 2, the pulse control module 112 also provides activating pulses to an RF synthesizer 120, which is part of an RF transceiver system, portions of which are enclosed by dash-line block 122. The pulse control module 112 also supplies modulating signals to a modulator 124 which modulates the output of the RF frequency synthesizer 120. The modulated RF signals are applied to an RF coil assembly 126 through an RF power amplifier 128 and a transmit/receive switch 130. The RF signals are used to excite nuclear spins in the patient, as will be described in more detail below.

The NMR signals from the excited nuclear spins are picked up by the RF coil assembly 126 and applied through the transmit/receive switch 130 to an RF preamplifier 132 and then to a quadrature phase detector 134. The detected signals are digitized by A/D converter 136 and applied to host computer 114 where they are employed to reconstruct a two-dimensional NMR image.

To practice the present invention, two major modifications must be made to this conventional system. First, the particular pulse sequence produced by the pulse control module 112 must be altered, and second, the manner and order in which the host computer 114 processes the NMR signals to reconstruct images must be altered. Both of these necessary changes in the conventional NMR imaging system will now be described in detail.

Referring still to FIG. 2, the processor 113 is a stand-alone microcomputer which is programmed to provide signals to the pulse control module 112 through a cable 150. As will be described below, these signals control the manner in which the phase encoding magnetic field gradient, $G_y$ is incremented as well as the polarity, or phase, of the r.f. excitation pulses. The processor 113 is also connected to the host computer 114 through an RS-232C serial data link 151. The host computer 114 may thus download scan parameters to the processor 113, and the processor 113 may report back the results of its processing to the host computer 114. Specifically, upon completion of the scan, the processor 113 provides the host computer 114 with data from which the cardiac phase, phase encoding amplitude and r.f. excitation pulse polarity can be discerned for each pulse sequence. It should be apparent to those skilled in the art that the functions performed by the processor 113 may be incorporated into the host computer 114 or the pulse control module 112, but in the preferred embodiment described herein, a microcomputer manufactured by IBM Corporation under the trademark "PC/XT" is employed.

The processor 113 receives a signal from an ECG monitor 152, which indicates the start of each cardiac cycle. An ECG monitor 152, manufactured by Hewlett-Packard is employed for this purpose. A 25 Hz four-pole filter 153 is employed within the ECG monitor 152 to reduce noise in this signal caused by the switching of the magnetic field gradients. Of course, other methods are known to those skilled in the art for monitoring the cardiac cycle.

Figure 3:
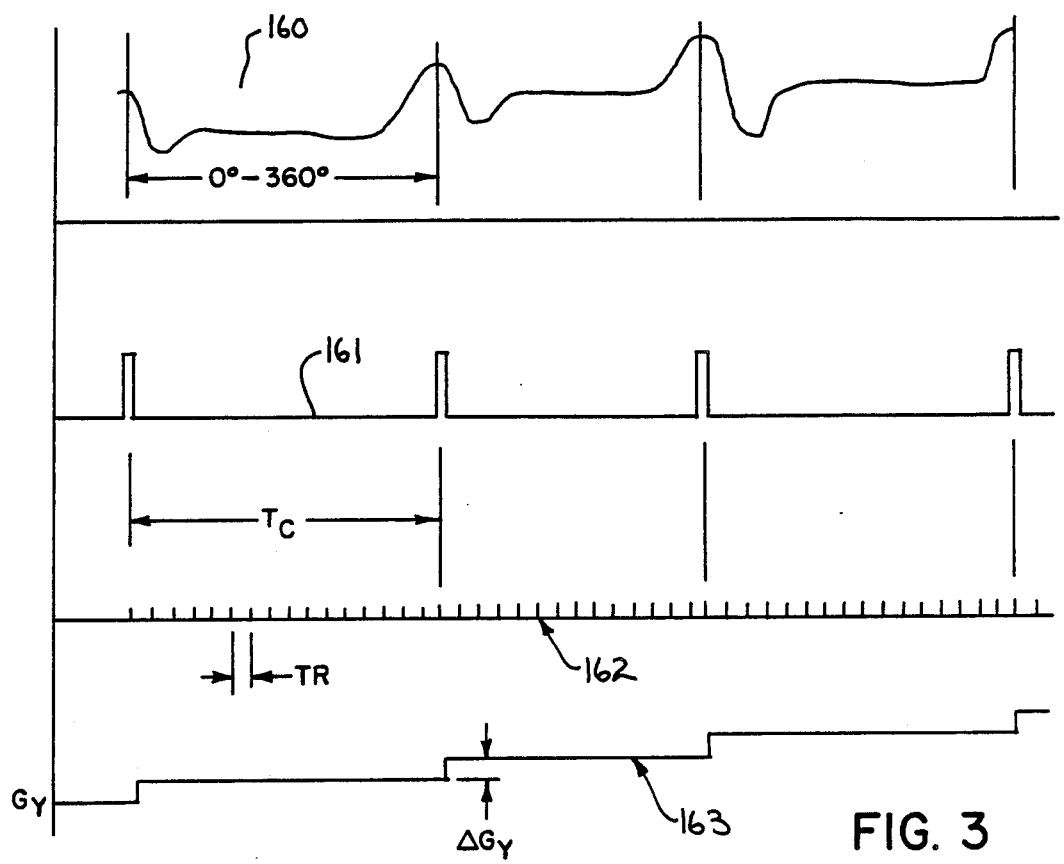
FIG. 3 is a graphic representation of the cardiac cycle of the patient in FIG. 1 and the asynchronous fast scan pulse sequence technique of the present invention.

Referring particularly to FIG. 3, a signal representative of the cardiac cycle is illustrated by the line 160, and the signal input to the processor 113 is indicated at 161. While the cardiac signal 160 is cyclic and substantially the same shape from cycle-to-cycle, the duration, or period ($T_c$), of each cycle varies. It is this variation in the cycle period of the heart which makes it difficult to produce a series of heart images covering the entire cardiac cycle using conventional cardiac-gated NMR techniques.

Figure 4:
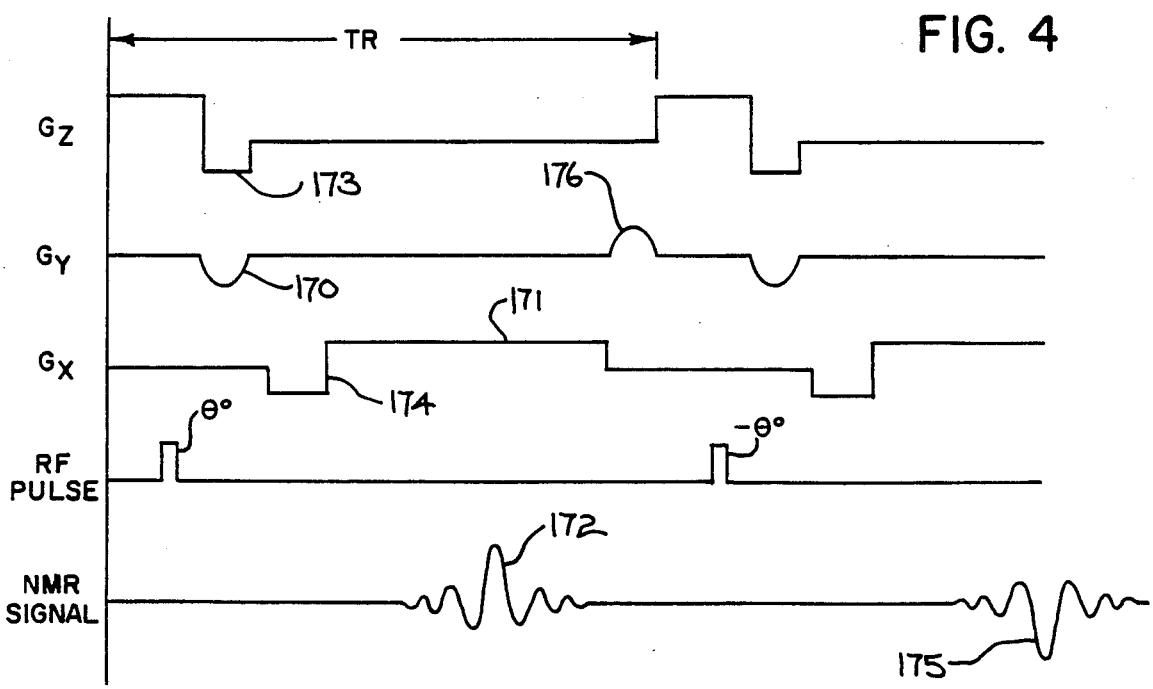
FIG. 4 is a graphic representation of an exemplary FT imaging pulse sequence of the type known as two-dimensional spin warp which may be employed in the NMR system of FIG. 2.

Referring particularly to FIGS. 3 and 4, the method of acquiring data according to the present invention employs a fast scan sequence, such as that illustrated in FIG. 4. This has a very short period (TR) in the order of 21 milliseconds. As shown at 162 in FIG. 3, the fast scan sequence is run continuously throughout each heart cycle to gather NMR data at a set of points or phases of the heart's functional cycle. The phase encoding gradient field ($G_y$ in the preferred embodiment) and the r.f. excitation pulse are kept constant during each heart cycle so that the acquired NMR data for that cycle represents one line in the Fourier transform of images from different points in the functional cycle. Thus, in one cardiac cycle, a subset of NMR data is produced which represents the Fourier transform of the object at one particular $K_y$ value at many cardiac phases. As indicated at 163, when the next heart cycle begins, the phase encoding field gradient $G_y$ is altered ($\Delta G_y$) so that the subset of NMR data subsequently acquired yields another line in the Fourier transform of each of the images. For example, if each image is to have 128 independent horizontal lines, then 128 heart cycles are required to gather the necessary 128 subsets of NMR data. The phase encoding gradient $G_y$ is incremented through 128 values in acquiring the necessary data set. It should be noted, however, that because the pulse sequences TR are run continuously throughout each cardiac cycle, a large amount of NMR data is rapidly acquired during all phases of each cardiac cycle. One or more images at any selected cardiac phase may thus be reconstructed after the entire 128 cycle data set is acquired.

Figure 5:
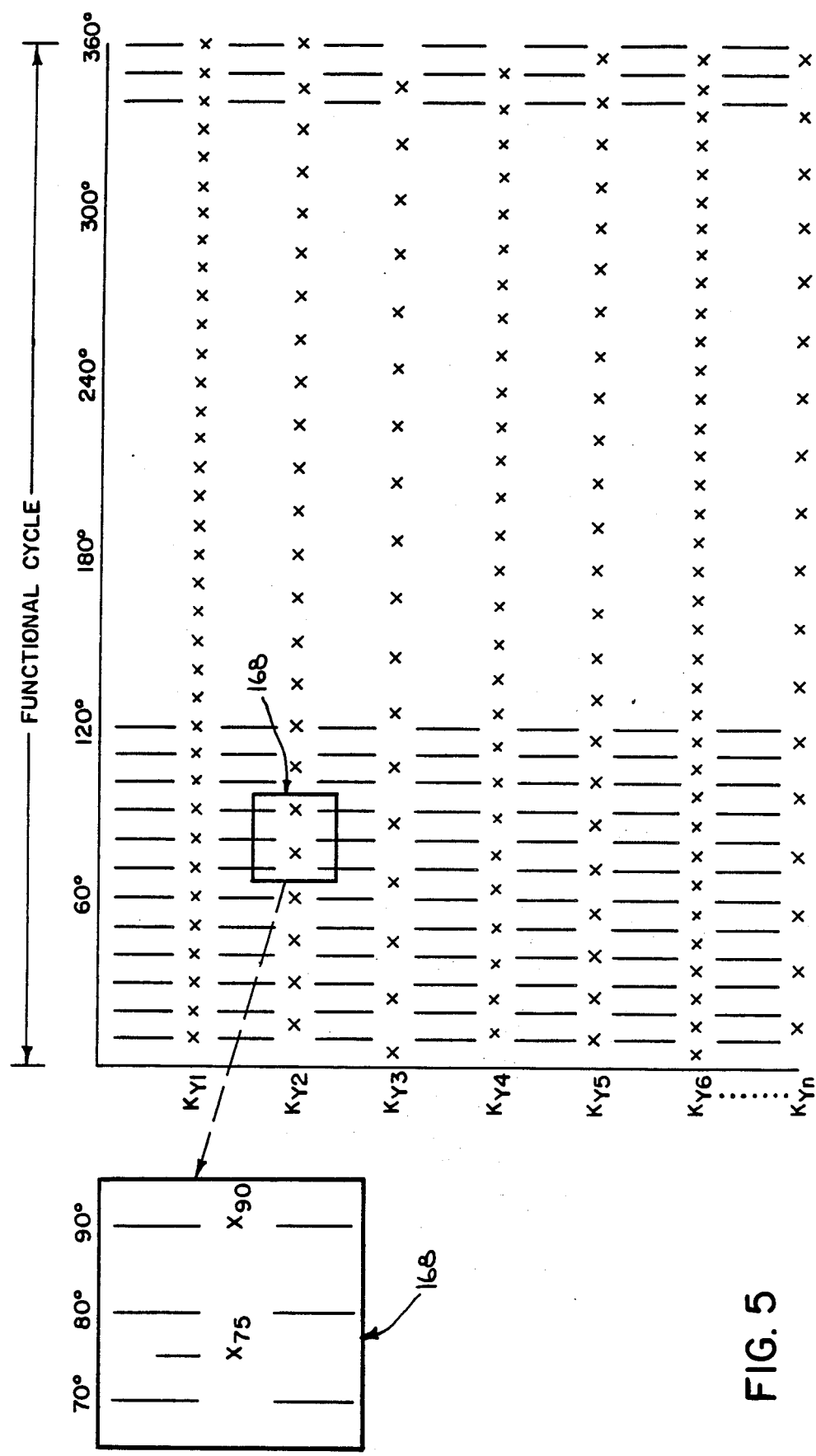
FIG. 5 is a graphic representation which illustrates how interpolation is employed to correlate the asynchronously acquired NMR data with the cardiac cycle of FIG. 3.

Referring particularly to FIG. 5, when all of the NMR data has been acquired, it is stored in digital form in the host computer 114 (FIG. 2) along with data which indicates the phase in the functional cycle at which each NMR signal was produced. Thus, for each line ($K_{y1}-K_{yn}$) of the raw NMR data to be reconstructed there is a set of phase data which correlates the NMR data with the phase of the functional cycle at the moment the NMR data was acquired. This correclated NMR data which was acquired continuously throughout a heart cycle is indicated by the "x's" in FIG. 5. Because the period Tc of each heart cycle varies and because the data is acquired asynchronously, the subset of NMR data for each line $K_{y1}-K_{yn}$ is different. For example, the first heart cycle during which NMR data for the first line $K_{y1}$ was acquired was quite long and many fast scan pulse sequences were performed. This is shown in FIG. 5 by the closely spaced "x's" which indicate that NMR data was acquired at approximately each ten degree increment of the cardiac cycle. On the other hand, the third heart cycle was shorter in duration and fewer fast scan pulse sequences were performed. This is shown in FIG. 5 as fewer "x's" in line $K_{y3}$. In addition, and as shown in lines $K_{y1}$ and $K_{y6}$, even when the periods of two heart cycles are identical, the NMR data which is acquired will not necessarily be at the same points in the heart cycle due to the asynchronous nature of the data acquisition relative to the cardiac cycle.

In the preferred embodiment the functional cycle is presumed to advance linearly as a function of time and the NMR pulse sequences are performed regularly like a clock. Under the circumstances, the correlation of the NMR data to the phase of the functional cycle is relatively simple. More specifically, the number of NMR data points which are acquired during any functional cycle are spaced apart equally along the horizontal axis in FIG. 5. Such "linear" correlation of the NMR data points to the phase of the functional cycle is not necessary to practice the present invention and other methods which correlate the acquired NMR data with the actual phase of the object being imaged may be employed.

To reconstruct an image from the stored data set, an interpolation process is employed. Referring still to FIG. 5, a single image is reconstructed using NMR data from each line $K_{y1}-K_{yn}$ at the selected phase of the heart cycle. For example, if an image is to be produced, which depicts the heart at the 80 degree point in its functional cycle, NMR data from each of the subsets must be obtained for the 80 degree point in the heart cycle. Of course, such data is not necessarily available in each subset because of the asynchronous nature of the present method. Instead, as shown at the box 168, line $K_{y2}$ includes NMR data ($X_{75}$) which was acquired at the 75 degree point in the heart cycle and NMR data ($X_{90}$) acquired at the 90 degree point. The required NMR data ($X_{80}$) must, therefore, be calculated from these two sets of stored digital data using the following linear interpolation algorithm:

$$X_T = X_{T1} + \frac{T - T1}{T2 - T1}(X_{T2} - X_{T1})$$

where:
T = desired phase
T1 = nearest available phase lower than T
T2 = nearest available phase greater than T For the $K_{y2}$ line this yields $X_{80}=(10/15)\,X_{75}+(5/15)\,X_{90}$. The same calculation is employed to calculate the required 80 degree NMR data for each line $K_{y1}-K_{yn}$ of the raw data set and this interpolated NMR data set is then employed to reconstruct an image in the conventional manner. It should be apparent to those skilled in the art that numerous alternative interpolation algorithms are available to perform this function. Also, where more NMR data is obtained than required, digital filtering techniques may be employed as part of the interpolation process to improve the signal-to-noise ratio of the final images. When such techniques are employed, more than two NMR data points from the nearest neighbors may be used.

The resulting set of interpolated NMR data is employed to reconstruct an image using a conventional two-dimensional Fourier transformation technique (2DFT). More specifically, the interpolated NMR data set $X_{80}$ is converted into the spatial domain by a two dimensional Fourier transformation program which is executed by the host computer 114. This transformation yields the intensity values of each pixel in the desired image. This entire interpolation and reconstruction process may then be repeated for other phases of the heart's functional cycle to produce a sequence of images which depict the heart at successive phases of its cycle. Because of the interpolation process which is used, the number of images produced and the points in the functional cycle which they depict are substantially independent of the specific number of cardiac phases sampled in the acquired NMR data. Of course, if insufficient data is acquired for the number of images sought, the images will not be independent and the motion picture representation will be blurred in time.

Referring again to FIG. 4, the particular fast scan pulse sequence which is employed in the preferred embodiment, provides NMR data for one horizontal line in the Fourier transformation of the slice to be imaged. The location and width of the image slice along the z axis is determined in part by the magnitude of the magnetic field gradient $G_z$ at the moment the r.f. excitation pulse is applied during this pulse sequence. The r.f. excitation pulse has a duration and amplitude which provides a $\theta$ degree (typically 30 degrees) tip of the magnetization, and its bandwidth is limited to control the thickness and location of the image slice. Phase encoding of the NMR signal is provided by the magnetic field gradient $G_y$ at the pulse 170, and frequency encoding of the NMR signal is provided by the magnetic field gradient $G_x$ at 171. A spin echo NMR signal 172 is produced by a gradient refocusing technique in which application of a polarity reversal in the $G_x$ magnetic field gradient at 174 produces a spin echo centered at the point where the total $G_x$ gradient integrates to zero. Flow compensation pulses (not shown in FIG. 4) may also be added to the $G_z$ and $G_x$ magnetic field gradients. The duration (TR) of the exemplary fast scan pulse sequence is 21 milli-seconds.

To implement the 2DFT imaging technique, the fast scan pulse sequence is changed during the data acquisition process. As explained above, the phase encoding magnetic field gradient $G_y$ is changed at the beginning of each cardiac cycle to collect NMR data for a different $K_y$ value for the imaged slice. In addition, to compensate for additive baselines present in the measured NMR signals, it is desirable to alternate the phase of the r.f. excitation pulse so that the polarity of the desired NMR signals 172 and 175 are reversed. This is illustrated in FIG. 4 as a $+\theta$ degree r.f. pulse during the first pulse sequence, and a $-\theta$ degree r.f. pulse during the next pulse sequence. Of course, the phase of the r.f. pulse is kept constant during each functional cycle.

Due to the short duration of each fast scan pulse sequence and the rapid rate at which they are performed, residual transverse magnetization remains at the end of each pulse sequence. This residual magnetization adds to the NMR signal produced during the subsequent pulse sequences and inconsistencies in it can distort the reconstructed image. Such distortion manifests itself as increased brightness in the images, but this only occurs when significant changes are made from one pulse sequence to the next. Such changes disturb the equilibrium of the residual transverse magnetization, and it has been found that two or three subsequent images are severely distorted. In a motion picture, for example, the problem appears as enhanced intensity each time the equilibrium is disturbed, i.e., at the beginning of the movie sequence.

As indicated above, there are two major view-to-view changes which occur in the preferred fast scan sequence that disturb this equilibrium: the changes in phase encoding gradient field $G_y$; and the changes in the phase of the r.f. excitation pulses. These changes are necessary, and it is a further discovery of this invention that they can be made without distorting the resulting images.

The effects of the changes made in the phase encoding magnetic field gradient $G_y$ are ameliorated in two ways. First, as shown in FIG. 4, a "rewinder" gradient pulse 176 is included in each fast scan pulse sequence. This rewinder pulse is identical to the phase encoding pulse 170, but it has the opposite polarity. The effect of the rewinder pulse 176 is to restore the phase of the residual transverse magnetization before the r.f. excitation pulse occurs in the next pulse sequence to a common state which is independent of phase-encoding pulse amplitude. While this reduces the resulting flash in reconstructed images, it may not be a complete solution if the gradient pulses are imperfect due, for example, to eddy currents.

The second method employed to solve this problem is to alter the manner in which the phase encoding magnetic field gradient is changed during the data collection sequence. This is shown best in FIG. 6, which illustrates data collection during two successive cardiac cycles ($TC_1$ and $TC_2$). From the description above it will be recalled that at the end of each heart cycle the phase encoding field gradient $G_y$ is incremented by an amount $\Delta G_y$ to produce NMR data for the next line in the Fourier transform of the reconstructed image. To avoid this large change which disrupts the equilibrium of the residual transverse magnetization, the invented method employs a series of smaller changes $\delta G_y$ during each sequence. This change is made after each fast scan pulse sequence (TR) and the amount of the change is calculated by dividing the total desired change $\Delta G_y$ by the predetermined number of fast scan pulse sequences (N) expected during the cardiac cycle. The amount of each such change in phase encoding magnetic field gradient $\delta G_y$ is very small and any disturbance of the residual transverse magnetization equilibrium is minimal. As a result, distortion of the reconstructed images due to changes in phase encoding gradient is eliminated. In cases where the number of sequences in one cardiac cycle is greater than N, the phase encoding amplitude is not incremented after the Nth sequence. If the cardiac cycle is short and fewer than N sequences are performed, the phase encoding amplitude is incremented by an appropriate amount at the beginning of the next cardiac cycle to correct for this effect.

Figure 6:
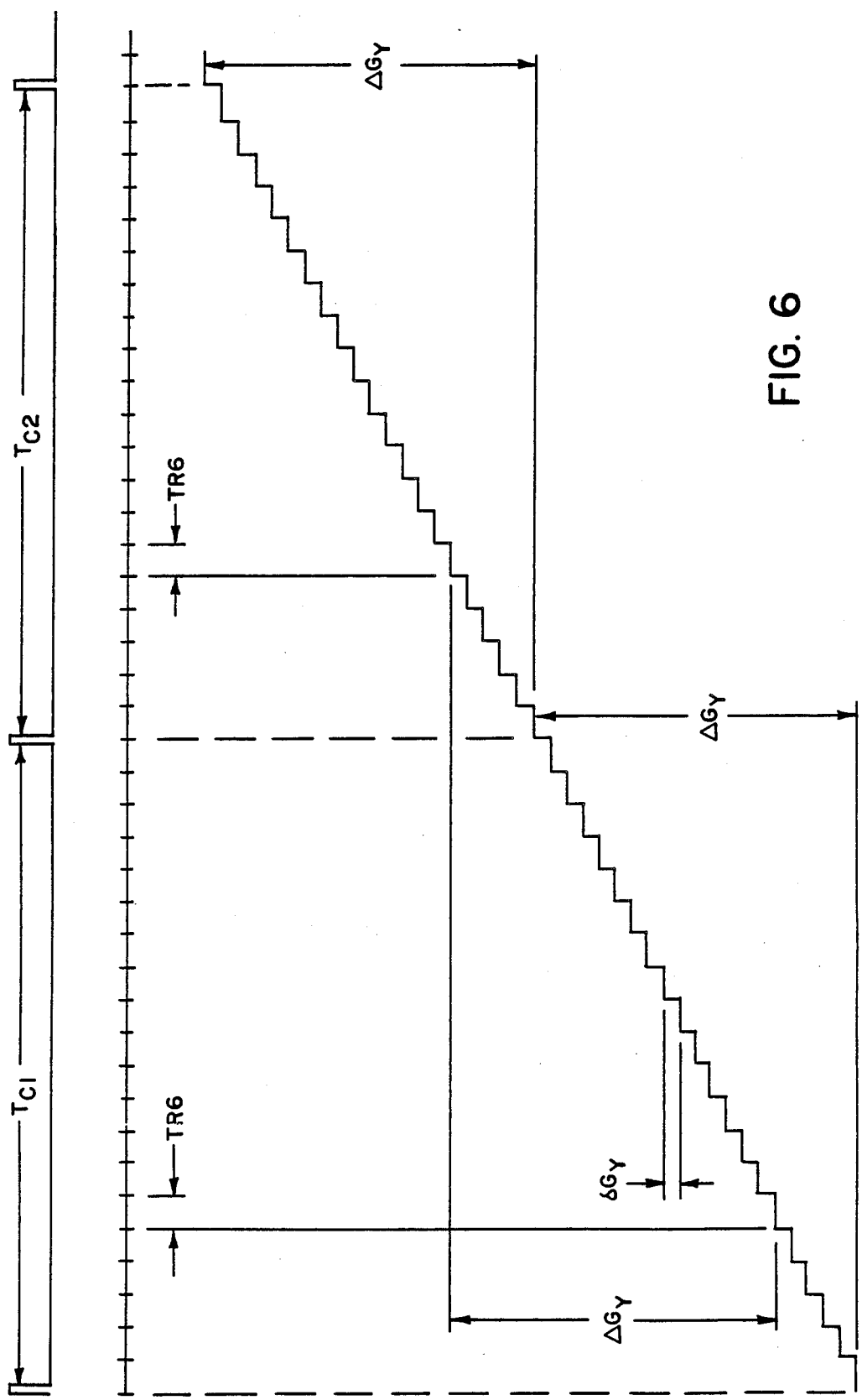
FIG. 6 is a graphic representation which illustrates an improvement to the asynchronous fast scan sequence of FIGS. 3 and 4 which minimizes disturbance of the residual transverse magnetization and improves image quality.

Referring still to FIG. 6, it should be noted that while the phase encoding gradient $G_y$ is incremented in small steps $\delta G_y$, the difference in phase encoding gradient between NMR data acquired during successive cardiac cycles is still substantially $\Delta G_y$. For example, if an image is reconstructed using the NMR data collected during the sixth fast scan pulse sequence (TR6) of each heart cycle, the phase encoding field gradient differs by the required $\Delta G_y$. Each image can, therefore, be properly reconstructed. It should be apparent, however, that minor phase errors can occur. For example, the number of pulse sequences may differ from one heart cycle to the next. This, in combination with the interpolation technique described above, may result in NMR data which is not acquired in precise $\Delta G_y$ increments. It has been found that such anomalies do not have significant effect on the reconstructed images.

The second major disrupting influence on the equilibrium of the residual transverse magnetization is the alternating phase of the r.f. excitation pulses. Because the phase of the r.f. excitation is kept constant during the complete functional cycle, an equilibrium is established. If one changes the phase of the r.f. excitation at the beginning of the next functional cycle, this equilibrium is disturbed. This disruption is eliminated according to the present invention by re-ordering the sequence in which the NMR data is acquired. This sequence is explained with reference to FIG. 7, in which images are to be formed with NMR data acquired during twenty cardiac cycles $T_c$. It can be appreciated by those skilled in the art that images are more typically formed with either 128 or 256 lines, and the choice of twenty lines is made only for convenience of illustration.

Referring to FIG. 7, the reordered data acquisition sequence requires that the phase encoding magnetic field gradient $G_y$ be incremented $2\Delta G_y$ during each cardiac cycle $T_c$ with constant positive r.f. excitation pulse phase. The odd-numbered gradient steps, or lines in the raw data, are thus produced during the first ten cardiac cycles. This first segment of the data acquisition procedure is indicated at 180. The gradient $G_y$ is then dropped in value at 181, the sign of the r.f. excitation pulse is reversed, and the last ten cardiac cycles are completed, while the phase encoding magnetic field gradient is incremented through its even-numbered values in $2\Delta G_y$ steps per cardiac cycle. This second segment of the procedure is indicated at 182. In the preferred embodiment, of course, the gradient $G_y$ is not incremented in large steps but is increased in subincrements $2\delta G_y$ in accordance with the above-described teaching. This is indicated in FIG. 7 by the dashed lines 183 and 184.

As a result of this reordering, the phase of the r.f. pulses need not be changed at the beginning of each cardiac cycle. Instead, the phase is changed only at the end of each segment which is near the middle of the scan, as indicated by the dashed line 185 in FIG. 7. The effect of this single change on residual magnetization equilibrium is minimal, since it occurs at the edge of "$k_y$ space" where spectral density is minimal. The reconstructed images show no significant increase in brightness.

Of course, the reordered manner in which the NMR data is acquired requires that it be processed in a different order. More specifically, the data set for a selected image is assembled by alternately retrieving NMR data acquired during the first segment and the second segment. The resulting data set is comprised of NMR data acquired for successive values of the phase encoding magnetic field gradient $G_y$ (1 through 20). In addition, the reordered NMR data now has the desired alternating polarity by virtue of the fact that it is assembled from alternate segments of the acquisition procedure. The corrections for system anomolies can thus be made in the usual fashion as described above.

In another commonly used method for correcting baseline errors, two measurements are made at each phase encoding value and the polarity of the r.f. excitation pulse is alternated for each. This method may be carried out using the present invention by using the same phase encoding value for two cardiac cycles, each with a different r.f. excitation pulse polarity. Disturbance of the dynamic equilibrium of the transverse magnetization is minimized by using all the phase encoding amplitudes with one excitation pulse polarity, and then repeating all the phase encoding amplitudes with the other excitation pulse polarity.

It should be apparent to those skilled in the art that the present invention may be applied in a variety of ways. For example, NMR data for multiple slices or images may be acquired during a single scan. In such case, the order in which the NMR data is acquired may vary greatly from that described above. During a single cardiac cycle, for instance, NMR data may be acquired for one slice at one value of phase encoding value interleaved with the acquisition of NMR data for another slice at another phase encoding value. Similar variations in data acquisition order are possible when the method is applied to three-dimensional NMR imaging methods such as 3DFT. Regardless of the order in which it is acquired, if the NMR data is stored along with an indication of the position encoding values and the functional cycle phase value at the moment the data was acquired, the data can be sorted into the form illustrated by FIG. 5. The interpolation step of the present invention can then be applied to reconstruct the desired images.

It should also be apparent that because NMR data is acquired asynchronously with respect to the functional cycle, the NMR data may not be acquired at equal intervals or phase increments of the functional cycle. Referring to FIG. 5, for example, this is manifested as unequal spacing between the data points for any line, $K_{yn}$. As long as the acquired NMR data is properly correlated with the phase of the functional cycle, the interpolation step may be performed to reconstruct the desired image.

A method has been described for producing a series of NMR images which depict an object, such as the human heart, at successive phases of its functional cycle. It should be apparent to those skilled in the art that there are many other variations in the particular system hardware, pulse sequence, and image reconstruction method possible without departing from the invention which is set forth in the following claims.

We claim:

1. A method for producing an image with an NMR imaging system which depicts an object at a selected phase of its functional cycle, the steps comprising:
    (a) repeatedly executing an NMR pulse sequence throughout a functional cycle to acquire a subset of NMR data, said execution being asynchronous with respect to said functional cycle to produce NMR data at each of a plurality of phases of the functional cycle, and said NMR pulse sequence including a position encoding gradient pulse;
    (b) correlating the NMR data acquired during the execution of each NMR pulse sequence with the phase of the functional cycle at the time the NMR data is acquired;
    (c) repeating steps (a) and (b) for a plurality of functional cycles with a different position encoding gradient pulse employed during each functional cycle to produce other subsets of NMR data;
    (d) reconstructing an image at a selected phase of the functional cycle by interpolating between NMR data within each subset of acquired NMR data to produce a set of interpolated NMR data which is employed to produce the image.

2. The method as recited in claim 1 in which a linear interpolation is performed using the NMR data on each side of the selected phase during each of the plurality of functional cycles.

3. The method as recited in claim 1 in which the image is reconstructed from the interpolated NMR data using a two-dimensional Fourier transform process.

4. The method as recited in claim 1 in which step d is repeated at a plurality of successive phases of the functional cycle to produce a plurality of images which depict the object at successive phases of its functional cycle.

5. The method as recited in claim 1 in which the position encoding gradient pulse is altered by a selected increment ($\Delta G$) during each successive functional cycle, and said alteration is performed by changing the position encoding gradient pulse by a subincrement ($\delta G$) during each NMR pulse sequence that is run during the functional cycle,
Where:
    $\delta G = \Delta G/N$; and
    N = number of NMR pulse sequences run during the functional cycle.

6. The method as recited in claim 1 in which the object is a human heart and the NMR data is correlated with the cardiac phase by sensing an electrical signal produced by the operation of the human heart.

7. The method as recited in claim 1 in which the NMR pulse sequences executed during a first segment of said plurality of functional cycles produce NMR data subsets having one polarity and the position encoding gradient pulse is incremented through a set of odd values;
    the NMR pulse sequences executed during a second segment of said plurality of functional cycles produce NMR data subsets having the opposite polarity and the position encoding gradient pulse is incremented through a second set of even values; and
    the NMR data acquired during the first segment is interleaved with the NMR data acquired during the second segment prior to reconstructing the image.

8. The method as recited in claim 7 in which the polarity of the NMR data is altered by changing the phase of an r.f. excitation pulse produced during each NMR pulse sequence.

9. A method of producing an image with an NMR imaging system which depicts an object at a selected phase of its functional cycle, the steps comprising:
   (a) repeatedly executing an NMR pulse sequence throughout a plurality of functional cycles to produce NMR data, wherein said execution is asynchronous with respect to said functional cycles, wherein each NMR pulse sequence includes a position encoding gradient pulse characterized by a value, and wherein said value is altered during said repeated executions;
   (b) correlating the NMR data acquired during the execution of each NMR pulse sequence with the phase of the functional cycle at the time the data was acquired and the value of the position encoding gradient used;
   (c) generating an NMR data set for the selected phase of the functional cycle and a plurality of values of the position encoding gradient pulse by interpolation between measured NMR data, said interpolation using the known phase of the functional cycle at the time each pulse sequence was executed; and
   (d) producing an image at the selected phase of the functional cycle using the NMR data generated in step (c).

10. The method as recited in claim 9 in which a linear interplation is performed using the NMR data on each side of the selected phase during each of the plurality of functional cycles.

11. The method as recited in claim 9 in which the image is reconstructed from the interpolated NMR data using a two-dimensional Fourier transform process.

12. The method as recited in claim 9 in which steps c and d are repeated at a plurality of successive phases of the functional cycle to produce a plurality of images which depict the object at successive phases of its functional cycle.

13. The method as recited in claim 9 in which the position encoding gradient pulse is altered by a selected increment ($\Delta G$) during each successive functional cycle, and said alteration is performed by changing the position encoding gradient pulse by a subincrement ($\delta G$) during each NMR pulse sequence that is run during the functional cycle,
Where:
   $\delta G = \Delta G/N$; and
   N = number of NMR pulses sequences run during the functional cycle.

14. The method as recited in claim 9 in which the object is a human heart and the NMR data is correlated with the cardiac phase by sensing an electrical signal produced by the operation of the human heart.

15. The method as recited in claim 9 in which the NMR pulse sequences executed during a first segment of said plurality of functional cycles produce NMR data subsets having one polarity and the position encoding gradient pulse is incremented through a set of odd values;
   the NMR pulse sequences executed during a second segment of said plurality of functional cycles produce NMR data subsets having the opposite polarity and the position encoding gradient pulse is incremented through a second set of even values; and
   the NMR data acquired during the first segment is interleaved with the NMR data acquired during the second segment prior to reconstructing the image.

16. The method as recited in claim 15 in which the polarity of the NMR data is altered by changing the phase of an r.f. excitation pulse produced during each NMR pulse sequence.

* * * * *